(12) United States Patent
Andoh et al.

(10) Patent No.: US 6,846,729 B2
(45) Date of Patent: Jan. 25, 2005

(54) PROCESS FOR COUNTER DOPING N-TYPE SILICON IN SCHOTTKY DEVICE TI SILICIDE BARRIER

(75) Inventors: Kohji Andoh, El Segundo, CA (US); Davide Chiola, Redondo Beach, CA (US); Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/254,112

(22) Filed: Sep. 25, 2002

(65) Prior Publication Data

US 2003/0062585 A1 Apr. 3, 2003

Related U.S. Application Data (60) Provisional application No. 60/326,510, filed on Oct. 1, 2001.

(51) Int. Cl.$^7$ ............................................. H01L 21/425
(52) U.S. Cl. ...................... 438/534; 438/570; 438/583; 257/454; 257/456; 257/473; 257/486
(58) Field of Search .................... 438/92, 534, 570, 438/FOR 173, FOR 335, 583; 257/155, 453, 454, 471, 473, 478, E29.148, E29.338, 486, 458

(56) References Cited

U.S. PATENT DOCUMENTS

| 4,914,500 A | * | 4/1990 | Liu et al. ..................... 257/384 |
| 5,962,893 A | * | 10/1999 | Omura et al. ................ 257/329 |
| 6,049,108 A | * | 4/2000 | Williams et al. ............. 257/341 |
| 6,078,090 A | * | 6/2000 | Williams et al. ............. 257/476 |

FOREIGN PATENT DOCUMENTS

| JP | 04005860 A | * | 1/1992 | ........... H01L/29/48 |

* cited by examiner

Primary Examiner—Paul E Brock, II
(74) Attorney, Agent, or Firm—Ostrolenk, Faber, Gerb & Soffen, LLP (57) ABSTRACT

A Schottky diode is adjusted by implanting an implant species by way of a titanium silicide Schottky contact and driving the implant species into the underlying silicon substrate by a rapid anneal. The implant is at a low energy, (e.g. about 10 keV) and at a low dose (e.g. less than about 9E12 atoms per cm$^2$) such that the barrier height is slightly increased and the leakage current reduced without forming pn junction and retaining the peak boron concentration in the titanium silicide layer.

14 Claims, 8 Drawing Sheets

PROCESS FOR COUNTER DOPING N-TYPE SILICON IN SCHOTTKY DEVICE TI SILICIDE BARRIER

RELATED APPLICATION

This application claims the benefit of U.S. Provisional Application No. 60/326,510, filed Oct. 1, 2001.

FIELD OF THE INVENTION

This invention relates to a process of manufacturing Schottky barrier diodes where Titanium Silicide is used as a Schottky barrier metal, and its effective barrier height is increased by means of Boron implantation through the Titanium Silicide layer, followed by drive-in by a high temperature diffusion or sintering process.

BACKGROUND OF THE INVENTION

The self aligned Silicide (or Salicide) process is known in CMOS technology to create thin films of low resistivity. As the device dimensions shrink, the area of diffused regions shrink accordingly, and the parasitic resistance (to lateral conduction) of the conductive film is increased. This adversely affects the device operation because of the increased heat dissipation and increased time delay of signal propagation.

Due to its low bulk resistivity, titanium silicide ($TiSi_2$) is an attractive material for lowering the sheet resistivity so that diffused regions can be connected over longer distances without additional heat dissipation.

However, the Schottky barrier height in these processes is not well controlled. It would be very desirable to control the barrier height of a titanium silicide Schottky device with a simple process.

BRIEF SUMMARY OF THE INVENTION

In the present invention a titanium silicide Schottky barrier diode is formed, using titanium silicide as a Schottky barrier metal and its barrier height is controlled by a novel counter-doping step.

As shown by comparative I-V measurements on non-implanted samples, the barrier height value of titanium silicide on N-type silicon is approximately 70 meV lower than molybdenum and 10 meV higher than vanadium, making this material a very good candidate for low forward voltage drop Schottky diodes required in applications where low power dissipation during forward conduction is the main requirement, such as portable equipment, disk drives, switching power supplies, battery charging and reverse battery protection equipment, converters and PC boards. A method of controlling the barrier height of titanium silicide is provided by the present invention, in order to "tune" the I-V trade-off characteristics over a range to meet different target specifications. Two successive annealing steps are used for the self-aligned titanium silicide formation process. For example, a thin (600 Å) layer of titanium is sputtered atop a silicon wafer, the wafer is annealed in a RTA system at a relatively low temperature (approx. 650° C.). The un-reacted titanium is next removed, preferably by an ammonia-based clean, and a low energy implantation to counter dope the underlying silicon is performed by way of the titanium silicide layer remaining after the un-reacted titanium is removed. Thereafter an etch in ammonia, water and hydrogen peroxide is preferably used because of the high selectivity against oxide and titanium silicide. A second anneal is then carried out at higher temperature (850° C.), and the implanted species is driven from the silicide layer into the silicon and activated to adjust the concentration of the silicon at the silicon surface. This simple 4-step process:

1. Anneal 1
2. Ti Etch
3. boron implantation (for an N type silicon substrate)
4. Anneal 2 completes the Schottky barrier formation. Process steps prior to Ti deposition and after the second anneal are part of the standard known process of Schottky diode manufacturing and need not be described.

The above barrier formation process has been used for both a planar Schottky diodes and Schottky diodes with a trench structure. In both cases a dependence of barrier height on the implanted dose is found and controlled, as demonstrated by Current-Voltage measurements on assembled parts which will be later described.

As indicated by forward drop measurements at a fixed forward current, the barrier height of the titanium silicide/silicon interface or contact can be increased by as much as 150 mV with a boron implant dose ranging from 0 to 9E13 atoms/cm$^2$ (for a trench diode). The amount of charge depends upon several factors, such as silicide thickness and stoichiometry (which, in turn, depends upon annealing conditions) and the silicon doping level. The process uniformity achievable is related to silicide uniformity and implanter accuracy. Due to the shallow diffusion desired by this process, a low energy implanter is preferred.

Stated in other terms, the boron implants after the first Suicide anneal and by way of the Silicide, controls the "tail" of the boron in the silicon to obtain counter doping of the N-epi. That is, it puts the boron profile peak inside the $TiSi_2$. This is done in such a way as to not create a P/N junction, but simply counter-dopes the N-type silicon reducing the N dopant concentration, and leakage current.

DETAILED DESCRIPTION OF THE DRAWINGS

Figure 1:
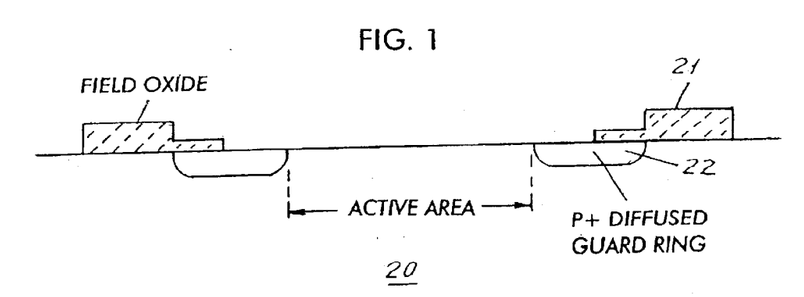
FIG. 1 is a cross-section of the top surface of a Silicon die for a planar device, after the formation of a field oxide, a P$^+$ guard ring and an etch to open the active area.

Referring first to FIG. 1, there is shown the first step in the process of manufacture of a planar diode which uses the invention. Only, the upper surface of the silicon is shown. Thus, a die 20 which may be comprised of an N⁻ epitaxial layer on an N⁺ substrate (not shown) has a field oxide 21 formed thereon. The N⁻ epitaxial layer may have a resistivity of about 0.1 to 0.5 ohm cm.

The field oxide 21 is patterned to permit the formation of a P⁺ diffused guard ring 22 of conventional structure. The field oxide is then opened to expose the silicon surface and an interior portion of the p⁺ ring 22, as shown by the labeled "active area". Thereafter, the top surface is cleaned, as with a 100:1 HF clean step for 30 seconds.

Figure 2:
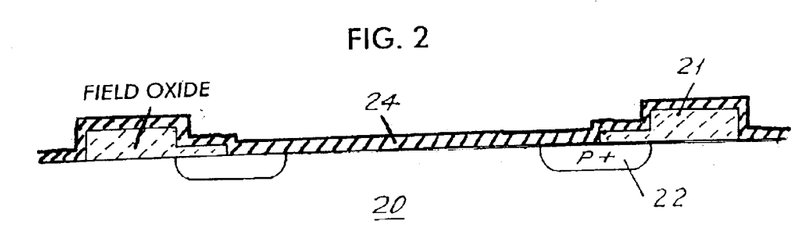
FIG. 2 is a cross-section of FIG. 1 after a titanium-sputter step.

Titanium layer 24, shown in FIG. 2, is next sputtered or otherwise formed atop the die. For example, a 600 Å sputter may use a pre-heating station at approximately 300° C.

Figure 3:
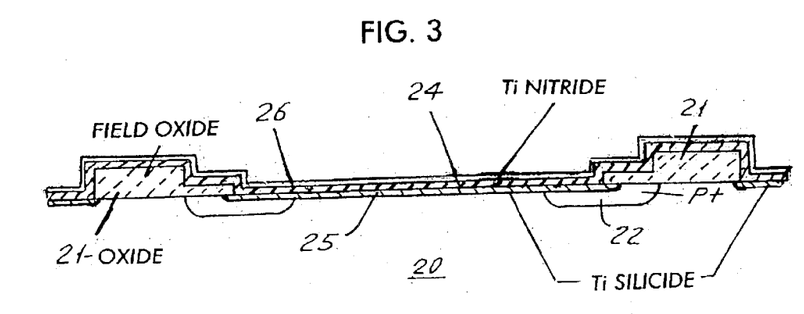
FIG. 3 is a cross-section of FIG. 2 after a thermal anneal.

Next, as shown in FIG. 3, a rapid thermal anneal is carried out at about 625° C. for 30 seconds in a nitrogen gas flow. This causes the formation of a titanium silicide layer 25 and the growth of a titanium nitride layer 26.

Figure 4:
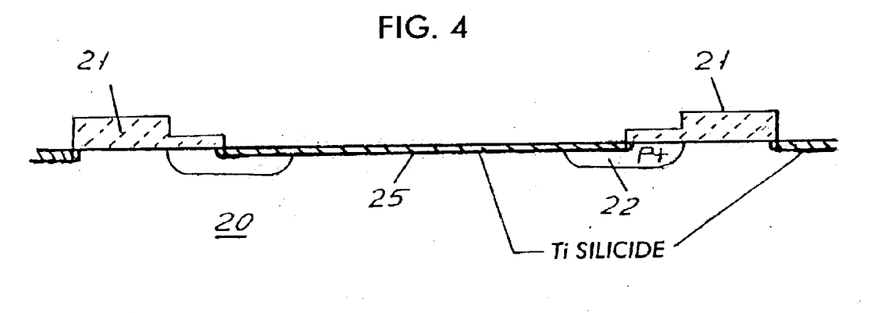
FIG. 4 is a cross-section of FIG. 3 after a titanium etch to remove metallic silicide and to expose the titanium silicide barrier in the active area.

Next, as shown in FIG. 4, a Ti etch is carried out, removing the titanium nitride and the unreacted titanium metal atop the titanium silicide layer. This etch may take place at 21° C. with continuous agitation, using $NH_4OH:H_2O_2:H_2O$ at a ratio of 6:1:1, followed by a deionized water flush and further flushes with $NH_4OH$ and $H_2O_2$.

Figure 5:
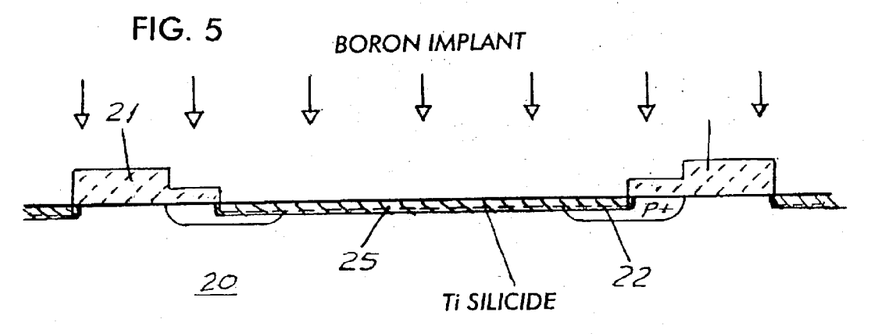
FIG. 5 is a cross-section of FIG. 4 with a boron implant through the $TiSi_2$ layer.

Next, as shown in FIG. 5, and in accordance with the invention, a low dose boron implant takes place through the titanium silicide layer 25. This implant is at a low energy of about 10 keV and at a low dose of from $10^{11}$ to $10^{13}$ atoms/cm². Other P-type implant species may be used.

Figure 6:
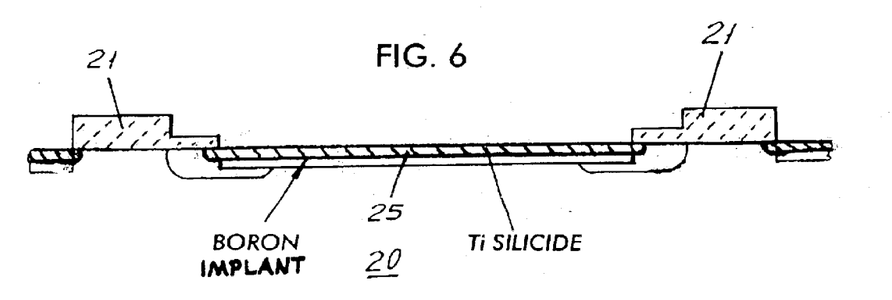
FIG. 6 is a cross-section of FIG. 5 after a rapid thermal anneal to drive and activate the boron implant.

As next shown in FIG. 6, the boron implant is driven and activated in a second rapid thermal anneal process at 850° C. for 30 seconds in $N_2$ flow.

Following this second anneal, standard process steps for completing the Schottky device are used, of:

contact metal pre-clean and deposition;

contact metal mask;

contact metal etch; and back metal on the bottom of the N⁺ substrate (not shown).

Figure 7:
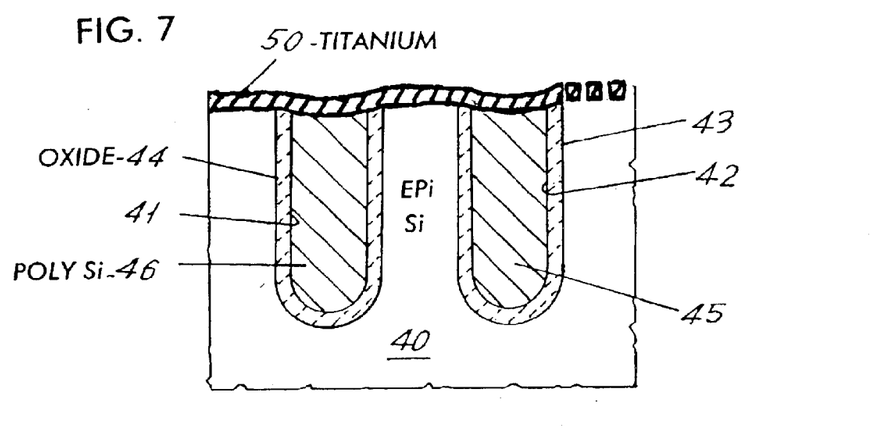
FIG. 7 shows a second embodiment of the invention, and shows a cross-section of two of a large number of parallel trenches after the formation of the trench, and filling the trench with an oxide liner and polysilicon and after a titanium sputter step.

As stated previously, the invention can also be applied to trench Schottky device. Thus as shown in FIG. 7, an N⁻ epitaxial silicon substrate 40 has plural parallel spaced trenches, such as trenches 41 and 42 therein. The trenches 41 and 42 have thin oxide liners 43 and 44 respectively and are filled with conductive polysilcon fillers 45 and 46 respectively.

After cleaning, and as shown in FIG. 7, there is a 600 Å titanium sputter as in FIG. 2, depositing titanium layer 50 on the tops of the mesas between the trenches. The titanium thickness is not critical.

Figure 8:
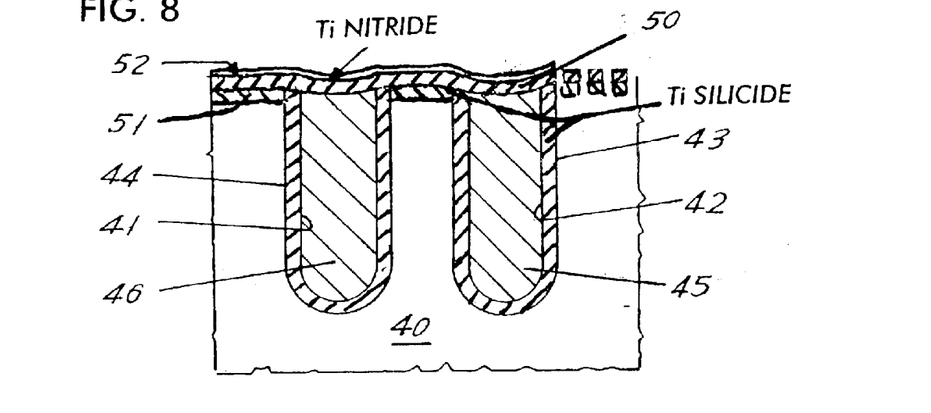
FIG. 8 is a cross-section of FIG. 7 after a rapid thermal anneal to form a titanium silicide.

Thereafter, and as shown in FIG. 8, there is a rapid thermal anneal in $N_2$ as in FIG. 3, forming titanium silicide layer 51 and the titanium nitride layer 52.

Figure 9:
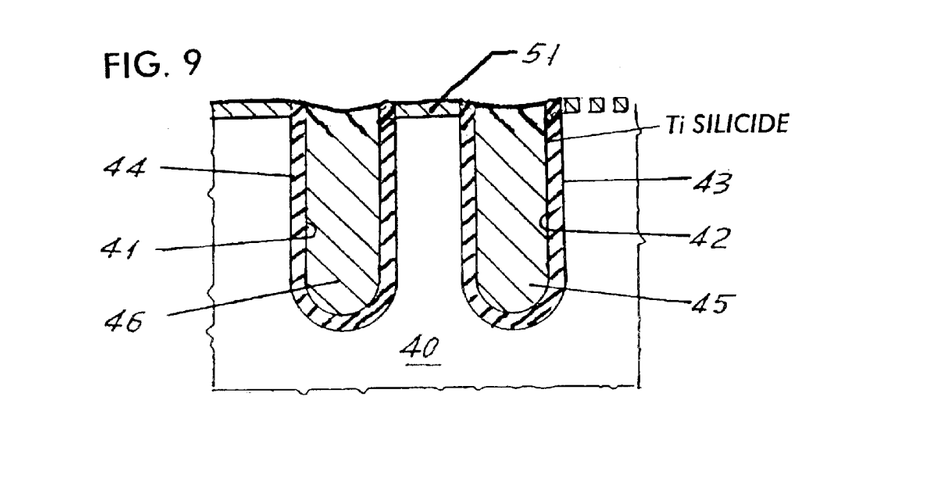
FIG. 9 is the cross-section of FIG. 8 after a titanium etch.

Next a titanium etch is carried out as in FIG. 4 to remove the titanium nitride layer 52 and titanium metal 50, producing the structure shown in FIG. 9.

Figure 10:
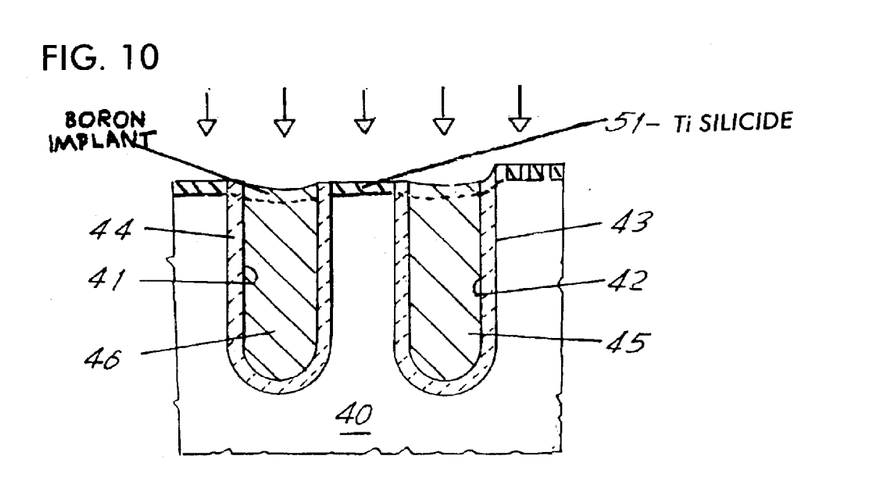
FIG. 10 is the cross-section of FIG. 9 showing a boron implant.

As next shown in FIG. 10, a boron implant is carried out at a low energy of about 10 keV and a low dose of 9E12 to 9E13 through the titanium silicide layer 51.

Figure 11:
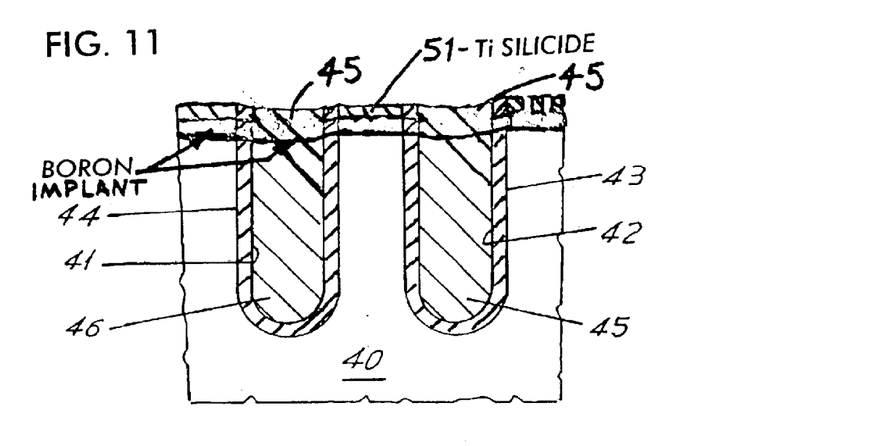
FIG. 11 is the cross-section of FIG. 10 after a second rapid thermal anneal.

Thereafter, and as shown in FIG. 11, a rapid thermal anneal process is carried out as in FIG. 6 to drive boron into the silicon mesas between trenches.

The Schottky device is then completed with the usual manufacturing steps for front and back metals.

In carrying out the process, it is useful to consider the following techniques:

Pre-cleaning—The clean before titanium sputter and after oxide etch can be any pre-metal clean available in the industry, or no cleaning at all. For example any $H_2SO_4$, HCI, HF, $NH_4OH$, $NH_4F$-based cleaning solutions can be used. That is because during the first anneal, about 1000 Å of silicon is converted to silicide, and the actual Schottky interface is moved inside the silicon epi-layer, making the final structure virtually independent of the condition of the original silicon surface.

Ti Deposition—Any technique can be used for titanium deposition; sputtering and electron beam evaporation being the most common techniques used in the industry. Any thickness of the titanium layer can be used. 600 Å is an optimized thickness, chosen to maximize the thickness of the silicide layer created after the first anneal, and to minimize the amount of unreacted titanium. This layer is removed in any case by the following cleaning step, and, if not controlled, would unnecessarily reduce the life of the titanium target.

Anneal1—The first annealing step can be any thermal process (furnace, RTA), such that the actual wafer temperature does not exceed ~750° C. At higher temperature, titanium starts reacting with thermal oxide. Removing the un-reacted titanium, by a wet etch, becomes very difficult and either a higher temperature of etchant solution or a longer etch time have to be used. Any inert carrier gas (nitrogen, argon, helium, forming gas) can be used during the anneal.

Ti Etch—The titanium etch after the first anneal can be any ammonium hydroxide and hydrogen peroxide-based solution. Etch time can vary, but etch temperature should not exceed about 80° C. to avoid excessively fast decomposition of the $H_2O_2$.

Implant—After the first anneal, any implant species that acts as a P-type dopant in N-type Silicon wafers (for N-type Silicon Schottky diodes) can be used. boron or $BF_2$, are the most common materials used in the industry. Maximum energy can be 50 keV. Low energy and low doses are preferred because high energy and heavy ion doses create more damage. The dose can be as high as $1 \times 10^{15}$ atoms/cm².

Anneal 2—The purpose of the second anneal is to remove the implant damage and activate and slightly drive in the implanted species. Minimum annealing temperature can be as low as 700° C., and a maximum around 1200° C. Any thermal process (furnace, RTA), can be used for this step. Annealing should be performed in a neutral ambient (nitrogen, argon, helium, forming gas) to avoid oxidation of the silicide layer.

Figure 12A:
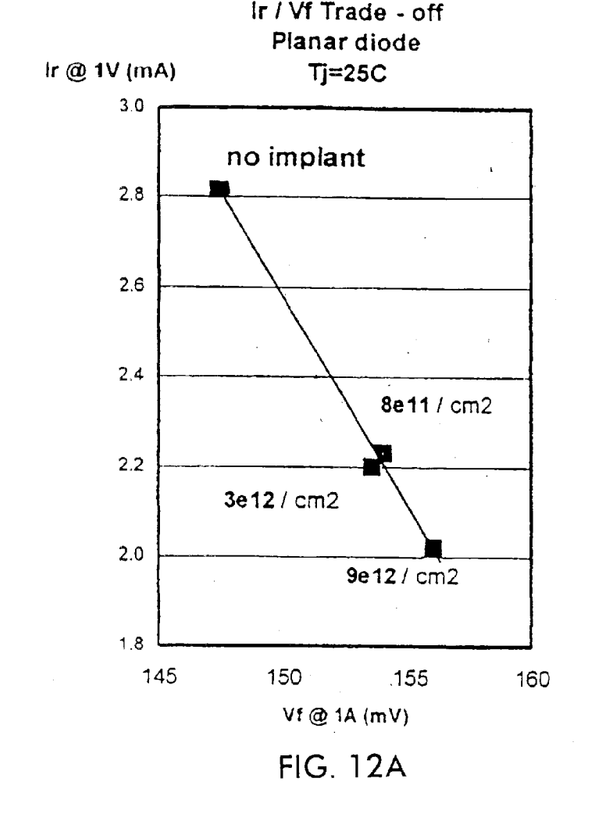
FIGS. 12A, 12B and 12C show the effect of the boron implant on the planar structure of FIGS. 1 to 6.
Figure 12B:
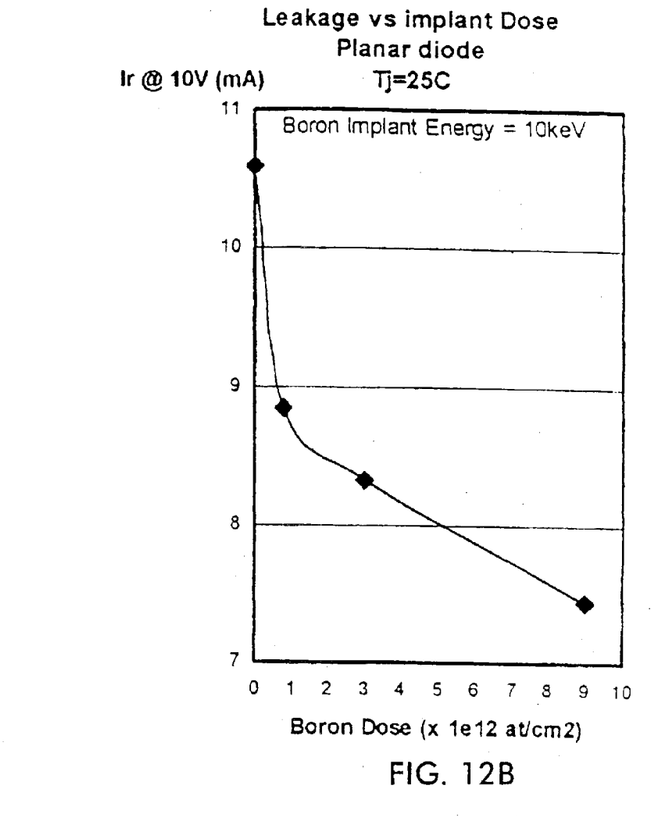
Figure 12C:
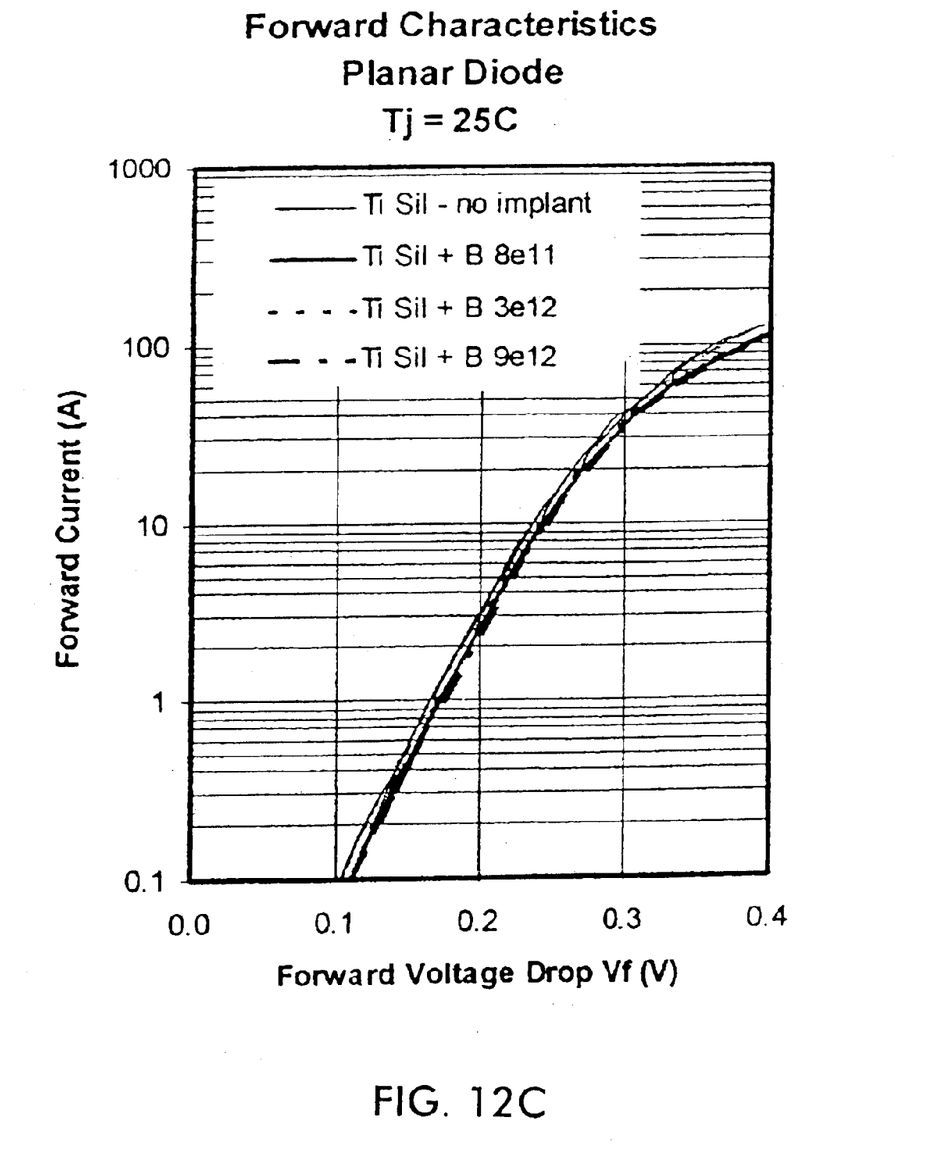

FIGS. 12A, 12B and 12C show the effect of the boron implant on the planar diode structure. The change in the forward voltage (V) to reverse current (I) trade off characteristics is related to the increase in barrier height with the boron implant dose (FIG. 12A). A small (10 mV) increase of barrier height is achieved for a boron dose up to 1E12 atoms/cm² as shown in FIG. 12B, with a 30% reduction in leakage current. No increase in series resistance was observed (FIG. 12C), and the I-V curves of implanted and non-implanted samples track one another.

Figure 13A:
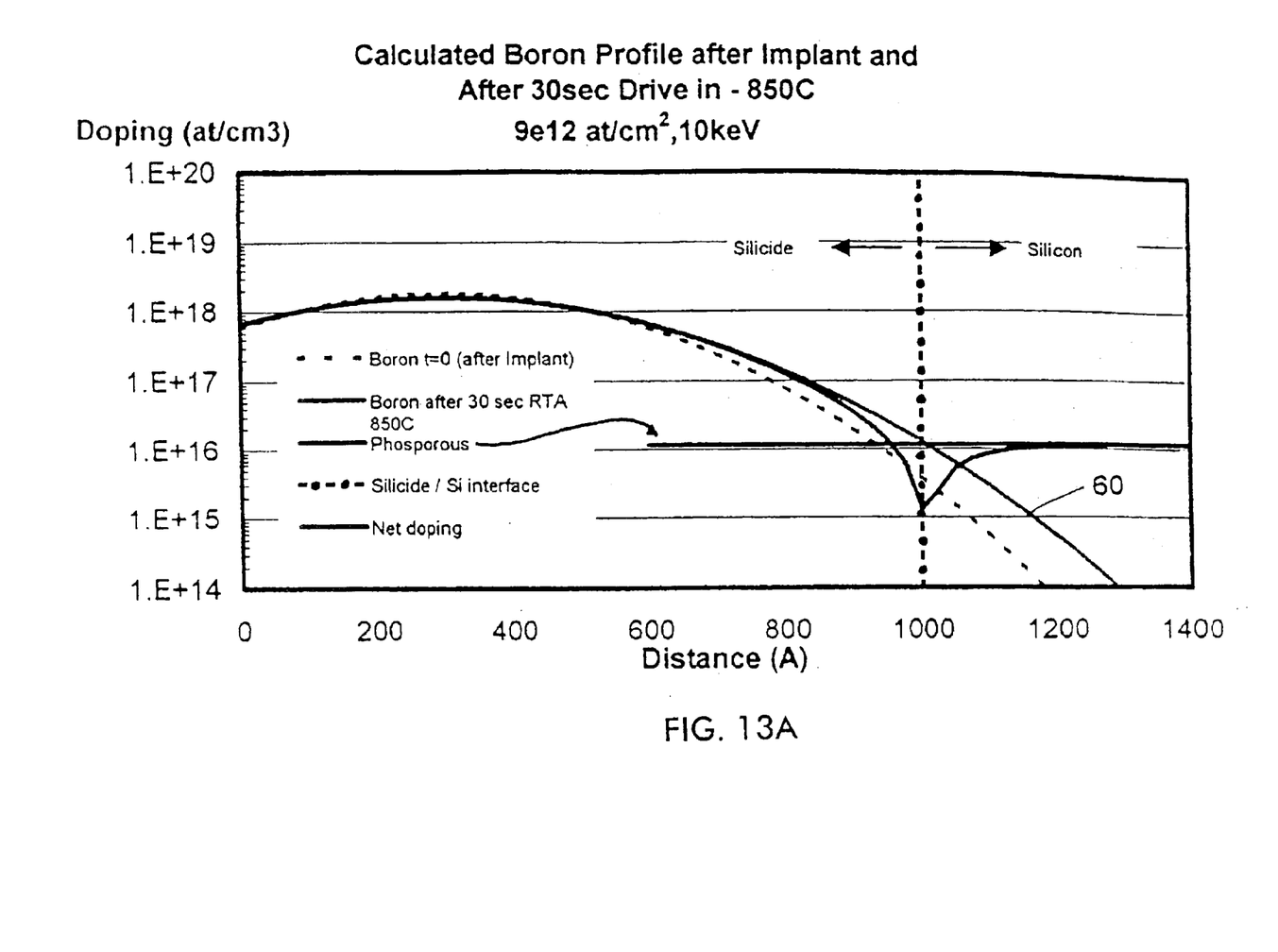
FIGS. 13A and 13B show the calculated boron profile after implant and drive for two doses, 9E12 and 9E13 atoms/cm$^2$, respectively.
Figure 13B:
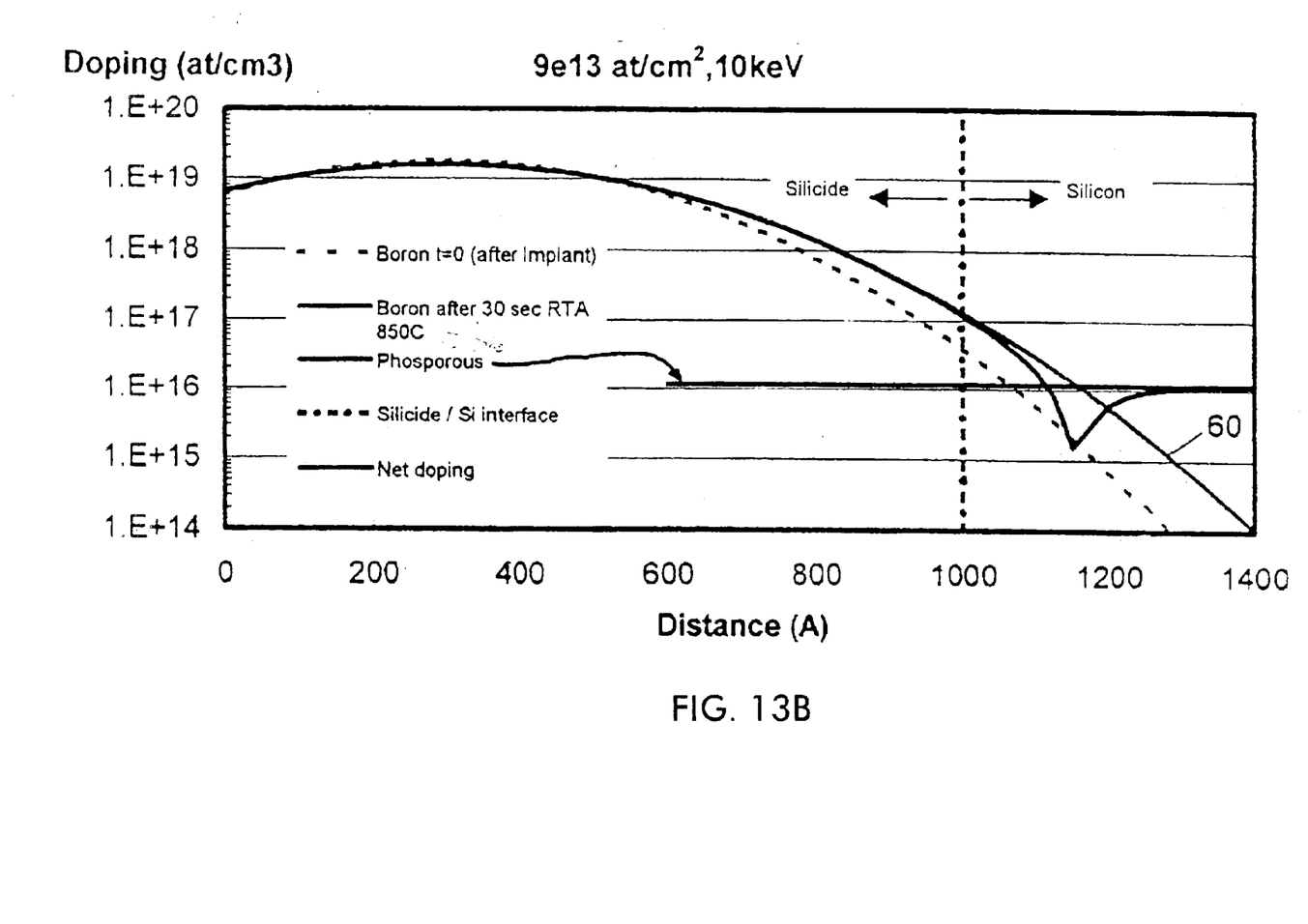

FIGS. 13A and 13B show the calculated boron diffusion profile after implant in FIGS. 5 and 10, and after a 30 second drive at 850° C. and at 10 kev for doses of 9E12 and 9E13 respectively. The thickness of the silicide is about 1000 Å. The boron profile (line 60) depends on the composition and actual thickness of the silicide. For an implant dose in the 1E12 range boron is barely confined within the silicide after drive in, and no change in barrier height is observed. Higher doses are substantially change the I-V trade-off characteristics.

As shown in FIG. 13A, no pn junction is formed after a thirty second drive-in anneal of the boron implantation at a temperature of 850° C., if the boron implant dose into the silicide is no greater than 9E12 at/cm². In Figures, a range of implant doses including 8E11 at/cm² (i.e. about 1E12 at/cm²), 3E12 at/cm² and no greater than 9E12 at/cm² decreases the leakage current, as shown in FIG. 12B, while slightly increasing the forward voltage. However, an implant dose within this range does not substantially impact the forward current versus forward voltage drop characteristics, as shown in FIG. 12C.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A Schottky diode having an adjusted barrier height comprising, a substrate of N-type silicon having a Schottky contact surface region; a titanium silicide contact layer in contact with said contact surface; and a low dose boron implant and anneal, wherein the low dose boron implant, after the anneal, at least partly counter dopes the N-type silicon beneath said titanium silicide layer such that no pn junction is formed and peak boron concentration is located in the titanium silicide layer.

2. The device of claim 1, wherein said diode is a planar diode and said contact surface region extends across the full active surface of said diode.

3. The device of claim 1, wherein said diode is a trench device and said contact surface region is the surface atop silicon mesas formed between adjacent trenches into said silicon.

4. The device of claim 1, wherein said boron implant has a dose of no greater than 9E12 atoms/cm².

5. A process of forming a Schottky barrier diode, comprising:

depositing a titanium layer on a surface of a silicon substrate forming an interface between the titanium layer and the silicon substrate;

heating the silicon substrate to a reaction temperature such that no significant oxidation of the titanium is formed and a titanium silicide layer is formed in the silicon adjacent to the interface;

etching the titanium layer to remove the titanium, except for the titanium silicide layer;

implanting an implant species in the titanium silicide layer using a low energy such that a peak concentration of the implant species is within the titanium silicide layer; and driving the implant species from the titanium silicide layer into the silicon underlying the titanium silicide layer by annealing such that a portion of the silicon substrate layer underlying the titanium silicide layer is at least partially counterdoped by the implant species without creating a pn junction in the silicon substrate and the peak concentration of the implant species remains in the titanium silicide layer.

6. The process of claim 5, wherein the implant species is boron.

7. The process of claim 5, wherein the step of implanting uses a dose of implant species no greater than 9E12 atoms/cm².

8. The process of claim 6, wherein the step of implanting uses a dose of implant species no greater than 9E12 atoms/cm².

9. The process of claim 5, wherein the step of heating forms a titanium silicide layer having a thickness of less than 1000 Å.

10. The process of claim 6, wherein the step of heating forms a titanium silicide layer having a thickness of less than 1000 Å.

11. The process of claim 9, wherein the step of implanting uses a low energy of about 10 keV.

12. The process of claim 10, wherein the step of implanting uses a low energy of about 10 keV such that the boron is implanted in the titanium silicide layer avoiding damage of the silicon substrate underlying the titanium silicide layer.

13. The process of claim 8, wherein the temperature during the step of driving the implant species is selected to be 850 degrees centigrade.

14. The process of claim 13, wherein the duration of the step of driving the implant species is selected to be about 30 seconds.

* * * * *